United States Patent [19]
Takahashi

[11] Patent Number: 6,022,777
[45] Date of Patent: Feb. 8, 2000

[54] METHOD OF MAKING SEMICONDUCTOR DEVICE

[75] Inventor: Keita Takahashi, Nara, Japan

[73] Assignee: Matsushita Electronics Corporation, Osaka, Japan

[21] Appl. No.: 09/055,541

[22] Filed: Apr. 6, 1998

[30] Foreign Application Priority Data

Apr. 8, 1997 [JP] Japan ..................... 9-089131

[51] Int. Cl.$^7$ .............................. H01L 21/8247
[52] U.S. Cl. .......................... 438/257; 438/592
[58] Field of Search ................... 438/257–267

[56] References Cited

U.S. PATENT DOCUMENTS

| | | |
|---|---|---|
| 5,330,924 | 7/1994 | Huang et al. . |
| 5,432,110 | 7/1995 | Inoue . |
| 5,753,525 | 5/1998 | Hsu et al. . |

OTHER PUBLICATIONS

A 0.67um2 Self–Aligned Shallow Trench Isolation Cell–(SA–STI Cell) For 3V–only 256Mbit NAND EEPROMs, S. Aritome et al., 1994 IEEE, pp. 3.6.1–3.6.4.

"A New Cell Structure For Sub–Quarter Micron High Density Flash Memory", Yoshimitsu Yamauchi et al., 1995 IEEE, pp. 11.2.1–11.2.4.

Primary Examiner—Richard Booth
Attorney, Agent, or Firm—Pearne, Gordon, McCoy & Granger LLP

[57] ABSTRACT

When a control gate electrode 7 is processed using a control gate electrode processing mask 8, the control gate electrode 7 in a region where the floating gate electrode 4 has been removed is partially left. Because of the presence of the left control gate electrode 7, the gate electrode interlayer insulating film 6 and gate insulating film 3 below the control gate electrode 7 are not dug in the region where the floating gate electrode 4 has been removed. Therefore, when the floating gate electrode 4 is removed, the semiconductor substrate is not dug. In this way, since the semiconductor substrate 1 is not dug, the semiconductor memory device can be manufactured stably and precisely.

7 Claims, 15 Drawing Sheets

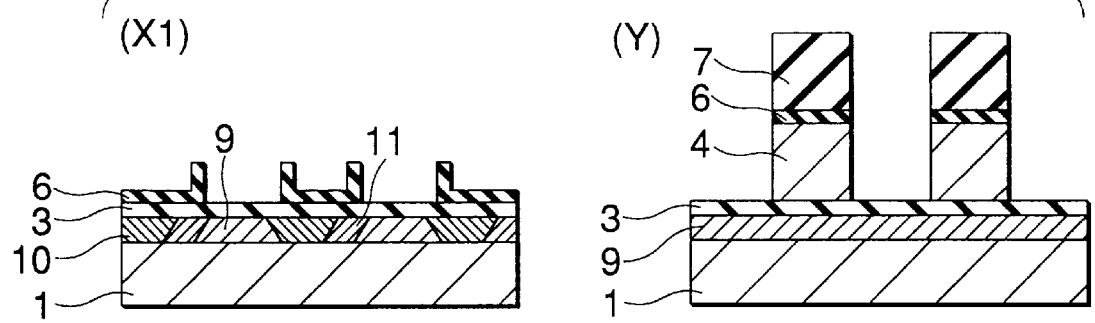
FIG.10
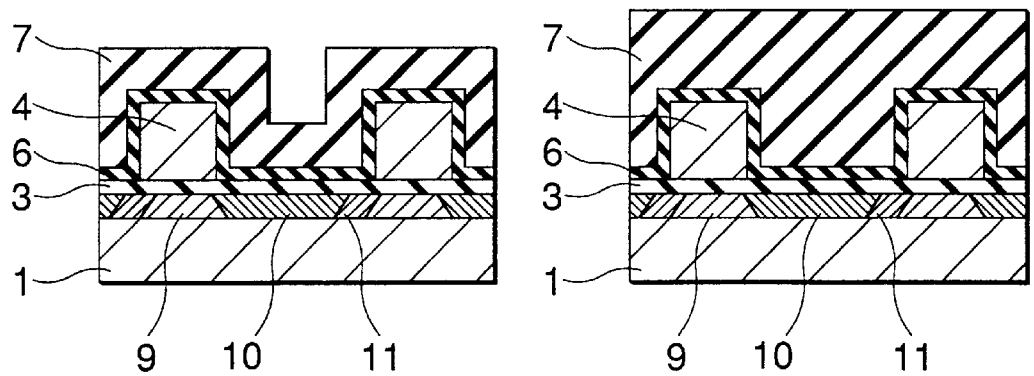
FIG.11(a) RELATED ART
FIG.11(b)

1

METHOD OF MAKING SEMICONDUCTOR DEVICE

BACKGROUND OF THE INVENTION

1. Field of the Invention

The present invention relates to a semiconductor memory device, and more particularly to a floating gate type non-volatile semiconductor memory device having two-layer gate electrodes of a floating gate electrode and a control gate and a method for fabricating it.

2. Description of a Related Art

In recent years, low-cost and large-capacity non-volatile semiconductor memory devices have been used. In order to provide such non-volatile semiconductor memory devices widely, a structure which can be easily micro-structured and its manufacturing method have been demanded.

Now, referring to step sectional views of FIGS. 19 to 26, an explanation will be given of a method of manufacturing a conventional semiconductor memory device.

In FIGS. 19 to 26, reference numeral 1 denotes a semiconductor substrate; 2 an element isolation insulating film; 3 a gate insulating film; 4 a floating gate electrode; 5 a floating gate electrode processing mask; 6 a gate electrode interlayer insulating film; 7 a control gate electrode; and 8 a control gate electrode processing mask.

First, a relatively thick element isolation insulating film 2 is selectively formed on a semiconductor substrate 1. On the surface of a region of the semiconductor substrate 1, not covered with the element isolation insulating film 2, a gate insulating film 3 is grown. Thereafter, on the element isolation insulating film 2 and gate insulating film 3, a floating gate electrode 4 is grown (FIG. 20). On the floating gate electrode 4, a floating gate electrode processing mask 5 having a prescribed pattern is formed, and thereafter the floating gate electrode 4 is patterned into a prescribed pattern (FIG. 21). After the floating gate electrode processing mask 5 is removed, on the floating gate electrode 4, element isolation insulating film 2 and an exposed area of the gate insulating film 3, a gate electrode interlayer insulating film 6 is formed, and a control gate electrode 7 is formed thereon (FIG. 22). On the control gate electrode 7, a control gate electrode processing mask 8 having a prescribed pattern is formed (FIG. 23). Further, using the control gate electrode processing mask 8, the control gate electrode 7 is processed in a prescribed pattern (FIG. 24). Exclusive of a part of the gate electrode interlayer insulating film 6 just below the patterned control gate electrode 7 and portions of the gate insulating film 3 and element isolation insulating film 2, the remaining area of the gate electrode interlayer insulating film 6, the floating gate electrode 4, the gate insulating film 3 and element isolation insulating film 2 is selectively removed (FIG. 25). After part of the floating gate electrode 4 and semiconductor substrate 1 are removed, the control gate electrode processing mask 8 is removed (FIG. 26).

Referring to step sectional views of FIGS. 27 to 37, an explanation will be given of another method of manufacturing a conventional semiconductor memory device. This method is a method of manufacturing a semiconductor memory device having a pattern shown in a plan view of FIG. 1. In each of FIGS. 27 to 37, the views (X1) on the left side correspond to the portion along line X1—X1 in FIG. 1, whereas the views (Y) on the right side correspond to the portion along line Y—Y in FIG. 1.

In FIG. 27 to 37, reference numeral 9 denotes an implanted region for controlling a threshold value; 10 a source/drain implanted region; 11 an offset region, 12 a substrate dig-preventing insulating film; and reference numerals 1 to 8 refer to like elements in the step sectional views of FIGS. 19 to 26.

First, an implanted region 9 is formed on the one principal surface of a semiconductor substrate 1 by ion implantation (FIG. 27). After a gate insulating film 3 is formed on the implanted region, a floating gate electrode 4 is grown thereon (FIG. 28). A floating gate processing mask 5 having a prescribed pattern is formed on the floating gate electrode 4. Using the floating gate electrode processing mask 5, the floating gate electrode 4 is processed in a prescribed pattern (FIG. 29). By slanted ion implantation, a source/drain implanted region 10 and an offset region 11 are formed in the implanted region 9 (FIG. 30). The floating gate electrode processing mask 5 is removed and a substrate digging preventing insulating film 12 for preventing substrate from being dug is grown on the floating gate electrode 4 and gate insulating film 3 (FIG. 31). The entire substrate digging preventing insulating film 12 is removed to such a thickness as the upper face of the floating gate electrode 4 is exposed and the insulating film 12 is also left on the semiconductor substrate (FIG. 32). A gate electrode interlayer insulating film 6 is grown on the floating gate electrode 4 and substrate digging preventing insulating film 12, and a control gate electrode 7 is formed thereon (FIG. 33). A control gate electrode processing mask 8 having a prescribed pattern is formed on the control gate electrode 7 (FIG. 34). Further, using the control gate electrode processing mask 8, the control gate electrode 7 is processed in a prescribed pattern (FIG. 35). Exclusive of areas of the gate electrode interlayer insulating film 6 and substrate digging preventing insulating film 12 which are just below the patterned control gate electrode 7, the other area is removed (FIG. 36). After the floating gate electrode 4 is selectively removed, the control gate electrode processing mask 8 is removed (FIG. 37).

Referring to FIG. 38, an explanation will be given of an example of a conventional semiconductor memory device. In FIG. 38, the view (X2) on the left side is a sectional view taken along line X2—X2 in FIG. 1, whereas the view (Y) on the right side is a sectional view along line Y—Y in FIG. 1. In FIG. 38, like reference numerals refer to like elements in FIGS. 19 to 26 and FIGS. 27 to 37.

In this device, the source/drain implanted region 10 and offset region 11 are formed by slanted ion implantation so that an asymmetrical source/drain structure is realized. In this case, the source of a floating gate electrode 4a is a source/drain implanted region 10a and the drain thereof is a source/drain implanted region 10b. The source of the floating gate electrode 4b is a source/drain implanted region 10b and the drain thereof is a source/drain implanted region 10c.

This device operates in a virtual grounding system in which the same diffused layer is a source or drain according to the corresponding floating gate electrode 4.

A written state can be obtained in such a manner that with the control gate electrode 7 supplied with −10V, drain supplied with 3 V, source placed in a floating state and semiconductor substrate 1 placed in a grounded state, electrons are extracted from the floating gate 4 to provide a threshold voltage of about 1 V.

An erased state can be obtained in such a manner that with the control gate electrode 7 supplied with 12 V, and drain/source and semiconductor substrate 1 in a grounded state, electrons are implanted into the floating gate electrode 4 to provide a threshold voltage of about 4 V.

At the time of reading, the control gate electrode 7 and drain are supplied with 3 V and 1 V, respectively, and source and semiconductor substrate 1 are placed in the grounded state. Then, in the written state where the threshold voltage is about 1 V, a current flows from the drain to the source. On the other hand, in the erased state where the threshold voltage is about 4 V, no current flows from the drain to the source. By detecting such a current difference, the written state and the erased state can be discriminated from each other.

The performance of the non-volatile semiconductor memory device can be evaluated in terms of a capacitive coupling ratio CR. Assuming that the capacitance between the floating gate electrode 4 and control gate electrode 7 is Cp and that between the floating gate electrode 4 and semiconductor substrate 1 is Cox, the capacitive coupling ratio CR can be expressed by the following equation (1)

$$CR=Cp/(Cp+Cox) \quad (1)$$

Generally, the larger the value of the capacitive coupling ratio CR is, the better the performance is. However, the product which is actually available has a standard value of CR=0.60.

In FIG. 38, assuming that the width of the floating gate electrode 4 is 0.3 $\mu$m, height of the floating gate electrode 4 is 0.3 $\mu$m, height of the area covered by the gate electrode interlayer film 6 on the side of the floating gate electrode 4 is 0.15 $\mu$m, thickness of the gate insulating film 3 is 7 nm and thickness of the gate electrode interlayer film 6 is 14 nm, $$CR=0.50$$

This value is smaller than the standard value of CR=0.60.

However, the conventional manufacturing method, in which the area corresponding to the region where the floating gate electrode is removed is dug by over-etching as shown in FIG. 12d, has problems in reliability such as generation of a leak current and in manufacturing of a semiconductor memory device. In order to prevent the semiconductor substrate from being dug, the region where the floating gate electrode is to be removed must be formed on a relatively thick insulating film such as an element isolation insulating film, or the relatively thick insulating film must be embedded in the region where the floating gate electrode has been removed. There are still problems when realizing the microstructure of the semiconductor memory device and easiness of the manufacturing method.

The present invention intends to solve the problems, and to provide a method for manufacturing a semiconductor memory device which can prevent a semiconductor substrate from being dug without forming a region where a floating gate electrode is to be removed on a relatively thick insulating film, or otherwise embedding the relatively thick insulating film into the region where the floating gate electrode has been removed.

In the conventional semiconductor memory device, in which a portion of the side wall of the floating gate is only covered with the gate electrode interlayer insulating film, a sufficiently large capacitance between the gate electrodes cannot be obtained so that the capacitive coupling ratio necessary in operation cannot be obtained.

SUMMARY OF THE INVENTION

The present invention intends to solve the above problem, and to provide a semiconductor memory device having a floating gate with a small area capable of giving a sufficient capacitance between gate electrodes and capacitance coupling ratio.

In order to solve the above problem, the method for manufacturing a semiconductor memory device according to the present invention includes a step of leaving a part of the control gate electrode on the region where the floating gate electrode has been removed, when the control gate is processed.

The semiconductor memory device according to the present invention has a structure in which the side of the floating gate is covered with a gate electrode interlayer film so that it reaches a boundary between the floating gate electrode and a gate insulating film formed below it. This can provide a semiconductor memory device having the floating gate with a small area capable of giving a sufficient capacitance between gate electrodes and capacitance coupling ratio.

A first method of the present invention is a method of manufacturing a semiconductor memory device comprising a step of leaving a portion of the control gate in an entire region where the floating gate electrode has been removed with a width (preferably twice or less as large as the thickness of the control gate electrode), when the control gate electrode is processed. Because of the presence of the left gate electrode, when the gate electrode interlayer insulating film is removed, the gate electrode interlayer insulating film and gate insulating film 3 below the control gate electrode 7 are not removed in the above region. Therefore, when the floating gate electrode is removed, the semiconductor substrate can be prevented from being dug.

A second method of the invention is a method for manufacturing a semiconductor memory device in which the film thickness of the floating gate electrode is made half or more as large as that of the control gate electrode. For this reason, a potion of the control gate electrode can be left stably in the region where the floating gate electrode has been removed with a width twice or less as large as the film thickness of the control gate electrode.

A third method of the invention defined in claim 3 is a method for manufacturing a semiconductor memory device in which a floating gate electrode does not operate as the semiconductor substrate is formed in a region where the interval between the floating gate electrodes operating as the semiconductor memory device is twice or more as large as the film thickness of the control gate electrode so that the interval between the floating gate electrodes is twice or less as large as that of each the control gate electrode. For this reason, a potion of the control gate electrode can be left stably in the region where the floating gate electrode has been removed can be left stably in the entire region where the floating gate electrode has been removed with a width twice or less as large as the film thickness of the control gate electrode.

A fourth device of the present invention is a semiconductor memory device in which the side of the floating gate electrode is covered with the gate electrode interlayer insulating film to reach the boundary between the floating gate electrode and gate insulating film therebelow. For this reason, a sufficient capacitance between the gate electrodes and a sufficient capacitive coupling ration can be obtained.

A first aspect of the present invention is a method of fabricating a semiconductor memory device, which comprises the steps:

forming a gate insulating film on a semiconductor substrate;

forming a first conductive film for a floating gate electrode on the gate insulating film;

selectively removing the first conductive film to form a slit on a region corresponding to an interval of the floating gate electrode;

forming a gate electrode inter-layer insulating film on the first conductive layer and in the slit;

forming a second conductive layer for the control gate electrode on the gate electrode inter-layer insulating film so as to be embedded substantially completely within the slit a the;

selectively removing the second conductive film to expose the gate electrode insulating film and to form the control gate electrode so that a portion of the second conductive film within the slit is left;

removing the gate electrode interlayer insulating film exposed on a surface of the substrate; and removing the second conductive film remained within the slit and the first conductive film exposed on a surface of the substrate to form the floating gate electrode.

A second aspect of the present invention is a method according to the first aspect, wherein the width of the slit is twice or less as large as a thickness of the second conductive film.

A third aspect of the present invention is a method according to the first aspect, wherein the step of selectively removing the second conductive film comprises a step of etching the second conductive film by anisotropic etching through a mask having a stripe-liked pattern to be the control gate electrode.

A fourth aspect of the present invention is a method according to the first aspect, wherein the width of control gate electrode is larger than that of the floating gate electrode.

A fifth aspect of the present invention is a method according to the first aspect, wherein the step of forming a second conductive layer comprises a step of depositing a polycrystalline silicon on condition that the slit is embedded completely.

A sixth aspect of the present invention is a method according to the first aspect, wherein a thickness of the first conductive film is half or more as thick as the second conductive film.

A seventh aspect of the present invention is a method according to the first aspect, wherein a width of said slit is equal or smaller than 400 nm.

A eighth aspect of the present invention is a method according to the first aspect, wherein thickness of the first conductive film is equal or larger than 100 nm.

A ninth aspect of the present invention is a method according to the first aspect, wherein thickness of the second conductive film is equal or larger than 200 nm.

A tenth aspect of the present invention is a method according to the first aspect, wherein the step of selectively removing the first conductive film comprises a step of etching the first conductive film by anisotropic etching.

An eleventh aspect of the present invention is a method according to the first aspect, wherein the step of forming a second conductive film comprises a step of depositing a conductive film by reduced pressure chemical vapor deposition method.

A twelfth aspect of the present invention is a method according to the first aspect, wherein the step of selectively removing the first conductive film further comprises a step of etching selectively the first conductive film so that the slit reaches to the gate insulating film.

A thirteenth aspect of the present invention is a method according to the first aspect, wherein the step of selectively removing the first conductive film is a step of etching the first conductive film so that a dummy floating gate electrode not directly contributing to a memory function is remained in a region where the interval between the floating gate electrodes contributing to the memory function.

A fourteenth aspect of the present invention is a method according to the thirteenth aspect, wherein the region is located so that the interval between juxtaposed two of the floating gate electrodes and the dummy floating gate electrodes is twice or less as large as thickness of each the control gate electrode.

A fifteenth aspect of the present invention is a device of the present invention, which comprises:

a semiconductor substrate having a plurality of source/drain regions; floating gate electrodes formed on a semiconductor substrate;

a gate electrode interlayer insulating film formed on the floating gate electrodes control gate electrodes formed on the floating gate electrodes formed on the gate electrode interlayer insulating film, wherein the floating gate electrodes at least contributing to a memory function, the upper face of the floating gate electrode and side thereof in a direction of extending the control gate electrode are covered with a gate electrode interlayer insulating film;

the gate electrode interlayer insulating film covering the side of the floating gate electrode is formed to reach the floating gate electrode and a gate insulating film formed therebelow; and for at least one region sandwiched between adjacent floating gate electrodes between the same control gate electrode, between the control gate electrode and a semiconductor substrate, the gate electrode interlayer insulating film or at least portion of the gate insulating film-and the gate electrode interlayer insulating film are present.

A sixteenth aspect of the present invention is a method according to the fifteenth aspect, wherein entire side surface of the floating gate electrode is covered with the gate electrode interlayer insulating film.

A seventeenth aspect of the present invention is a semiconductor memory device, which comprises:

a semiconductor substrate having a plurality of source/drain regions;

floating gate electrodes formed on a semiconductor substrate;

at least one of dummy floating gate electrodes not directly contributing to a memory function formed on a region where the interval between the floating gate electrodes contributing to the memory function;

a gate electrode interlayer insulating film formed on the floating gate electrodes and control gate electrode formed on the gate electrode interlayer insulating film.

An eighteenth aspect of the present invention is a semiconductor memory device according to the seventeenth aspect, wherein the region is determined so that the interval between juxtaposed two of the floating gate electrodes and the dummy floating gate electrodes is twice or less as large as thickness of each the control gate electrode.

BRIEF DESCRIPTION OF THE DRAWINGS

FIG. 10 is a step sectional view for explaining an embodiment of the method of manufacturing a semiconductor memory device according to the invention defined in claim 1.

FIG. 11A–11B are a sectional view of a related art for explaining effects of the embodiment of the invention shown in FIGS. 2–10.

DESCRIPTION OF THE PREFERRED EMBODIMENTS

Figure 1:
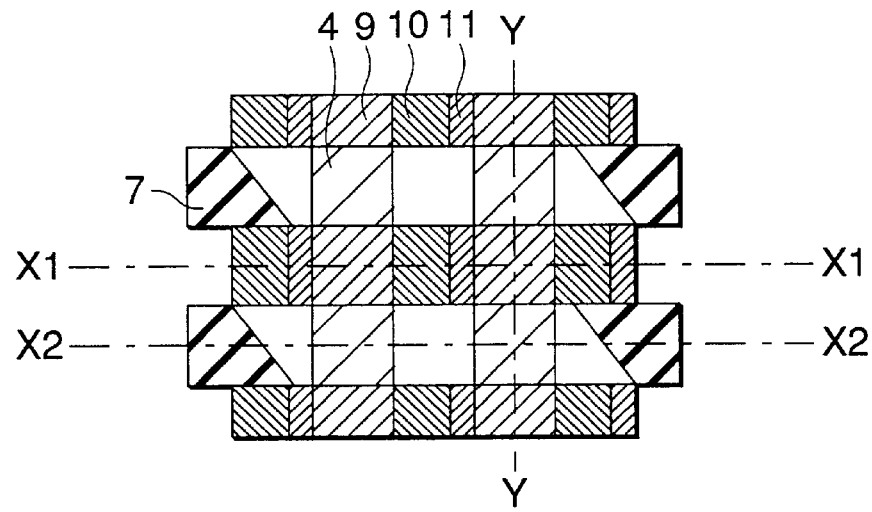
FIG. 1 is a plan view of an embodiment of the semiconductor memory device according to the invention defined in claims 1 and 4.

Now, referring to the drawings, an explanation will be given of the first embodiment of the invention.

FIG. 1 is a plan view of the semiconductor memory device to which this embodiment is applied. FIGS. 2 to 10 are step sectional views for explaining the manufacturing method according to this embodiment. In FIGS. 2 to 10, the views (X1) on the left side are sectional views taken along line X1—X1 in FIG. 1, whereas the views (Y) on the right side are sectional views taken along line Y—Y in FIG. 1.

In FIGS. 1 and FIGS. 2 to 10, reference numeral 1 denotes a semiconductor substrate; 2 an element isolation insulating film; 3 a gate insulating film; 4 a floating gate electrode; 5 a floating gate electrode processing mask; 6 a gate electrode interlayer insulating film; 7 a control gate electrode; 8 a control gate electrode processing mask; 9 an implanted region; 10 a source/drain implanted region; and 11 an offset region.

Figure 2:
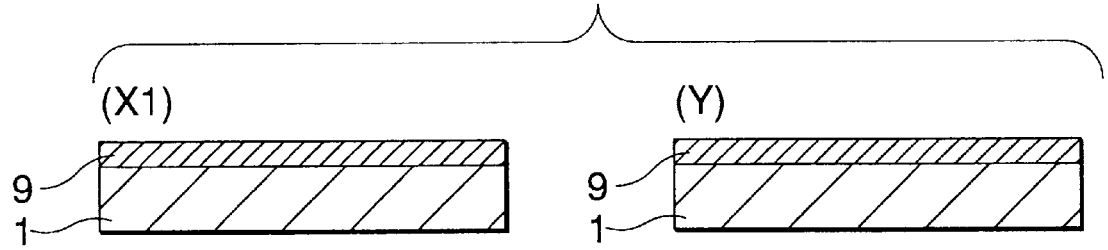
FIG. 2 is a step sectional view for explaining an embodiment of the method of manufacturing a semiconductor memory device according to the invention defined in claim 1.
Figure 3:
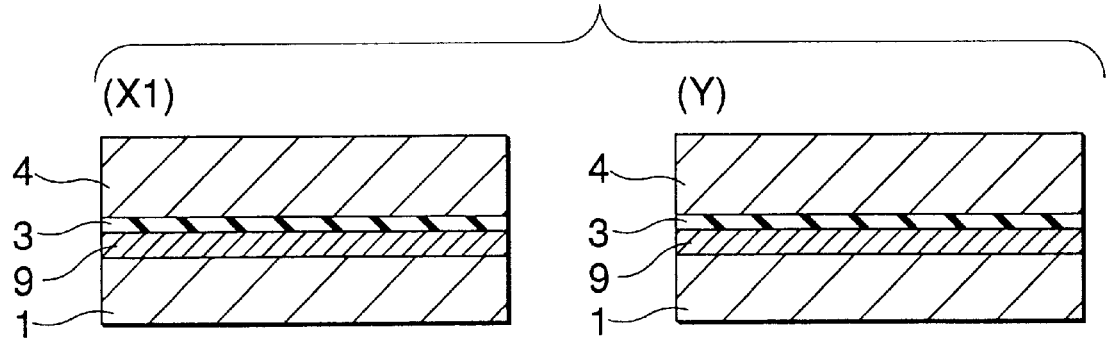
FIG. 3 is a step sectional view for explaining an embodiment of the method of manufacturing a semiconductor memory device according to the invention defined in claim 1.
Figure 4:
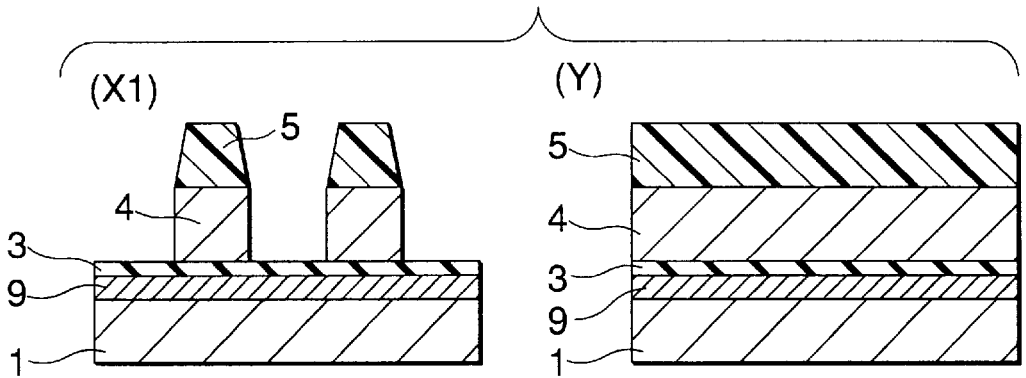
FIG. 4 is a step sectional view for explaining an embodiment of the method of manufacturing a semiconductor memory device according to the invention defined in claim 1.
Figure 5:
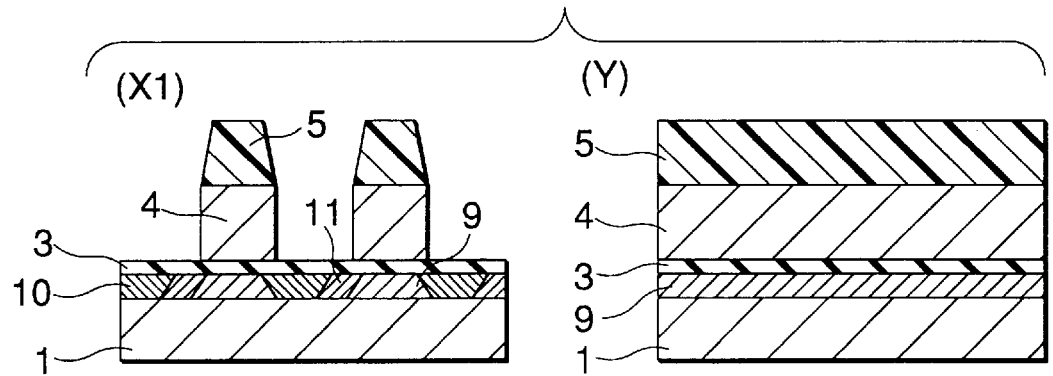
FIG. 5 is a step sectional view for explaining an embodiment of the method of manufacturing a semiconductor memory device according to the invention defined in claim 1.
Figure 6:
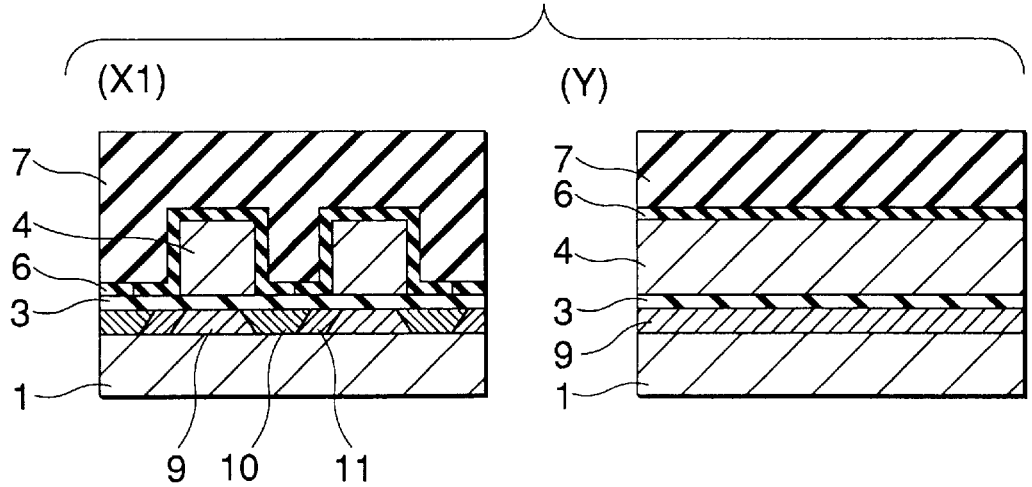
FIG. 6 is a step sectional view for explaining an embodiment of the method of manufacturing a semiconductor memory device according to the invention defined in claim 1.
Figure 7:
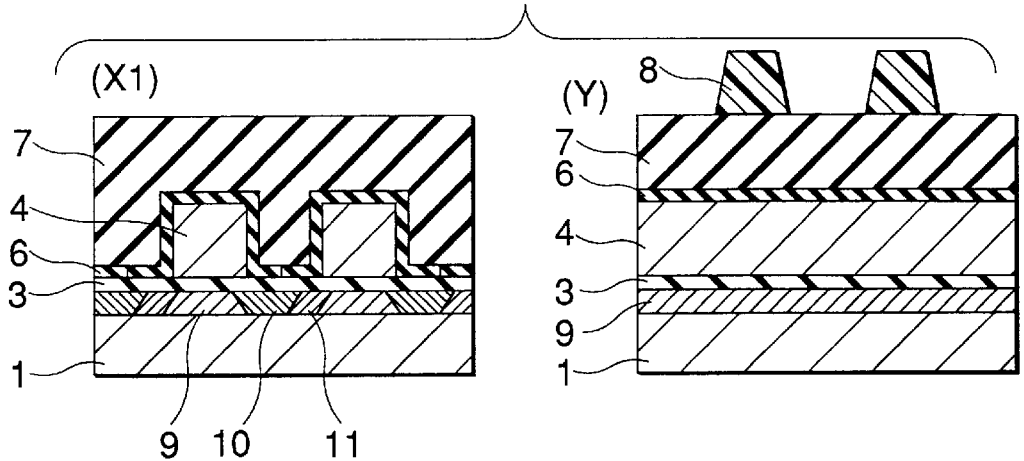
FIG. 7 is a step sectional view for explaining an embodiment of the method of manufacturing a semiconductor memory device according to the invention defined in claim 1.
Figure 8:
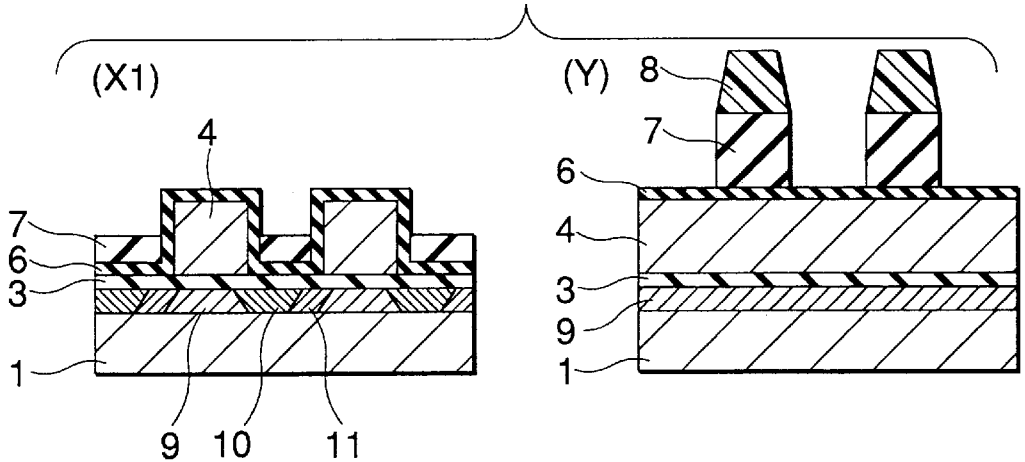
FIG. 8 is a step sectional view for explaining an embodiment of the method of manufacturing a semiconductor memory device according to the invention defined in claim 1.
Figure 9:
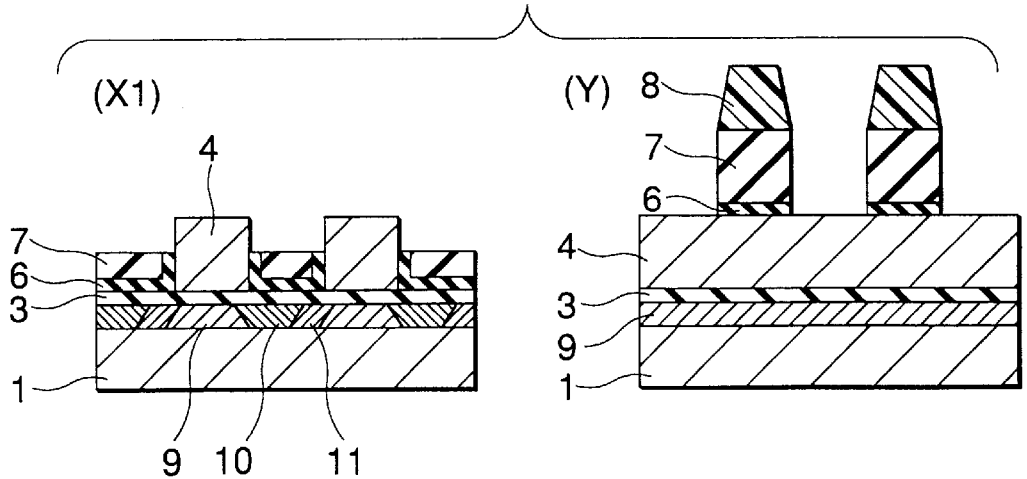
FIG. 9 is a step sectional view for explaining an embodiment of the method of manufacturing a semiconductor memory device according to the invention defined in claim 1.
Figure 12A:
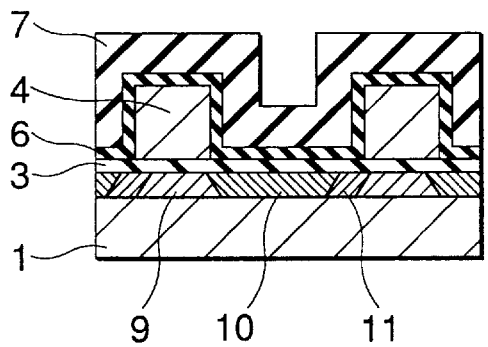
FIG. 12(A)–12(D) are a step sectional view of a related art for explaining an comparative example for a method of manufacturing the semiconductor memory device according to the present invention.
Figure 12B:
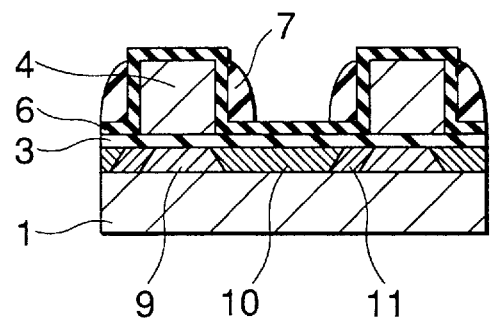
Figure 12C:
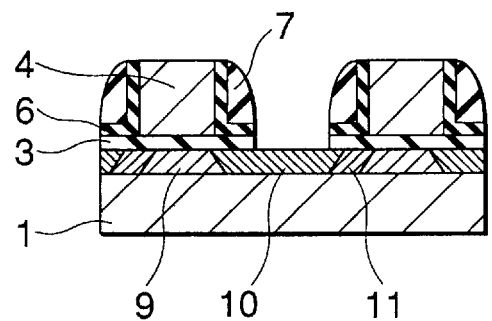
Figure 12D:
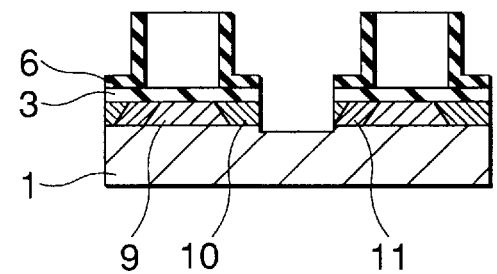

First, by ion implantation, an implanted region 9 is formed on the main surface of a semiconductor substrate 1 (FIG. 2). A gate insulating film 3 and a first conductive film such as a polycrystalline silicon as a floating gate electrode 4 are successively stacked on the implanted region 9 (FIG. 3). By a known photolithographic technique, a floating gate electrode processing mask 5 having a prescribed pattern is formed, and using the floating gate electrode processing mask 5, the floating gate electrode 4 is processed into a prescribed pattern (FIG. 4). Preferably the step of processing is conducted by anisotropic etching such as RIE method. According to the method, pattern of the floating gate electrode 4 which is highly faithful to a pattern of the processing mask 5. By slanted ion implantation, a source/drain implanted region 10 and an offset region 11 are formed within the implanted region 9 (FIG. 5). After the floating gate electrode processing mask 5 is removed, a gate electrode interlayer insulating film 6 is formed on the resultant entire surface. A second conductive film such as a polycrystalline silicon to be a control gate 7 is formed thereon (FIG. 6) by reduced pressure CVD method. According to reduced pressure CVD method, the second conductive film has a good step coverage is formed. By a known photolithography, a control gate electrode processing mask 8 having a prescribed pattern 8 is formed (FIG. 7). Using the control gate electrode processing mask 8, the control gate electrode 7 is processed into a prescribed pattern by anisotropic etching. In this case, a portion of the control gate electrode 7 which is located on the floating gate electrode 4 is completely removed. In addition, another portion of the control gate electrode 7, which is located on the region where the floating gate electrode 4 been removed with a width twice or lower as large as that of the control gate electrode 7, is left on the entire surface of the region (FIG. 8). The gate electrode interlayer insulating film 6 is removed (FIG. 9), and further the floating gate electrode 4 and control gate electrode 7 are removed. Therefore, the control gate electrode processing mask 8 is removed (FIG. 10).

An explanation will be given of the reason why the above processing can be carried out in the case where the floating gate electrode 4 has been removed with a width not larger than the thickness of the control gate electrode film.

FIGS. 11 and 12 are a sectional view for explaining one embodiment of the invention defined in claim 2. In FIGS. 11 and 12, like reference numerals refer to like elements in FIG. 2.

FIG. 11 is a view for explaining the details of the step of forming the above control gate electrode 7. FIG. 11(*a*) shows the case where the floating gate electrode 4 has been removed with a width three times as large as the thickness of the control gate electrode film. FIG. 11(*b*) shows the floating gate electrode 4 has been removed with a width twice as large as the thickness of the control gate.

As shown in FIG. 11(*b*), where the floating gate electrode 4 has been removed with a width twice or large as the thickness of the control gate electrode film, the control gate electrode 7 can be embedded in the region where the floating gate electrode 4 has been removed. In addition, the film thickness of the control gate electrode 7 on the region (slit 20) where the floating gate electrode 4 has been removed can be made larger than that on the floating gate electrode 4. Thus, the manufacturing method as shown in FIGS. 2 to 10. can be carried out.

FIGS. 12(*a*) to 12(*d*) is a step sectional view in which the above procedure is applied when the floating gate electrode 4 has been removed with a width three-times as large as the film thickness of the control gate electrode 7 for comparison (Refer to FIGS. 11(*a*)). It should be noted that the step corresponding to that after the floating gate electrode has been grown among the steps of the method explained in connection with FIGS. 1 and 2 to 10.

First, a control gate electrode 7 is formed on a gate electrode interlayer insulating film 6. An area of the control gate electrode 7 on a floating gate electrode 4 is completely removed. In this case, since the film thickness of a portion of the control gate electrode 7 on the region where the floating gate electrode 4 has been removed is equal to that of the control gate electrode 7 on the floating gate electrode 4, an exposed region of the gate electrode interlayer insulating film 6 is produced at a portion of the region where the floating gate electrode 4 has been removed (FIG. 12(*b*)). The exposed portion of the gate electrode interlayer insulating film 6 and the corresponding gate insulating film 3 immediately therebelow are selectively removed (FIG. 12(*c*)). The floating gate electrode 4 and the control gate electrode 7 left on the region where the floating gate electrode 4 has been removed are removed, and a portion of the semiconductor substrate 1 is removed. The control gate electrode processing mask is removed (FIG. 12(*d*)).

In this way, where the floating gate electrode 4 is removed with a width twice or more as large as the film thickness of the control gate electrode, like the prior art, a part of the semiconductor substrate 1 is removed. As a result, there occur problems in reliability and in fabrication of a semiconductor memory device such as generation of a leakage current.

On the other hand, in accordance with the embodiment of the present invention, when the control gate electrode 7 has been processed, the entire control gate electrode on the region, where the floating gate electrode 4 has been removed with a width twice or less as large as the film thickness of the control gate electrode, is left so that the semiconductor substrate in the above region can be prevented from being dug.

An explanation will be given of the reason why the manufacturing method explained in connection with FIGS. 2 to 10 can be carried out with good reproduction where the thickness of the floating gate electrode 4 has been made half or more as large as that of the control gate electrode 7.

Now it is assumed that the thickness of the grown film of the floating gate electrode 4 is $T_{fg}$ and that of the control gate electrode 7 is $T_{cg1}$. In this case, the film thickness $T_{cg2}$ of the control gate electrode 7 in the region where the floating gate electrode 4 has been removed with a width twice or less as large as that of the control gate electrode 7, if the control gate electrode 7 is completely embedded into the floating gate 4, $$T_{cg2} = T_{fg} + T_{cg1}$$

It is now assumed that variation of the thickness of the grown film of the control gate electrode 7 is ±10%, variation of etching rate of removing the control gate is ±10%, amount of over-etching necessary to remove the control gate electrode 7 completely on the floating gate electrode 4 is 20%, and the film thickness of the control gate electrode 7 to be left in the entire region where the floating gate electrode 4 has been removed is 10% of the thickness of the grown film of the control gate electrode 7. Under such an assumption, the difference between $T_{cg2}$ and $T_{cg1}$ in film thickness, i.e. thickness $T_{fg}$ of the grown film of the floating gate electrode 4, relative to the thickness Tfg of the grown film of the floating gate electrode 7, is $$10+10+20+10=50[\%]$$

Incidentally, the amount of over-etching necessary to remove the control gate electrode 7 on the floating gate 4 is assumed 20% in the estimation that the film thickness increased effectively when the maximum gradient of an underlying material is 30° is $$1/\cos 30° = 1.16 \approx 1.2$$

In the embodiment, the width of the slit 20, an interval between the floating gate electrode is preferably equal or smaller than 500 nm, the thickness of the floating gate electrode is preferably equal or larger than 125 nm and the thickness of the control gate electrode is preferably equal or larger than 250 nm.

In this way, in accordance with the method of manufacturing a semiconductor memory device according to this embodiment, by setting the film thickness of the floating gate electrode for half or more as large as that of the control gate electrode, when the method defined in the first aspect of the present invention is carried out, the semiconductor substrate can be stably prevented from being dug in the region where the floating electrode is removed on the gate insulating film.

Now referring to a sectional view of FIG. 13, an explanation will be given of the second embodiment of the present invention.

In FIG. 13, reference numeral 2 denotes an element isolation insulating film, and other reference numerals denote the corresponding elements in FIGS. 2 to 10.

Figure 13A:
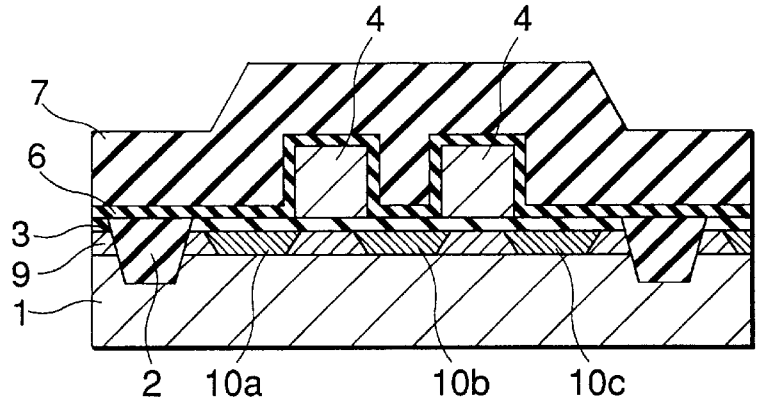
FIG. 13(A)–13(B) are a step sectional view of an embodiment of the method for manufacturing the semiconductor memory device according to the present invention.

FIG. 13(a) is a view for comparison. As seen from the figure, since the interval between floating gates 4 is large, a level difference is provided in the control gate 7 so that in the peripheral region of the element isolation insulating film 2, the film thickness of the control gate 7 is equal to that on the floating gate electrode 4. Therefore, when the portion on the control gate electrode 7 is removed, the substrate will be dug for the same reason as in a comparative example explained using FIG. 12.

Figure 13B:
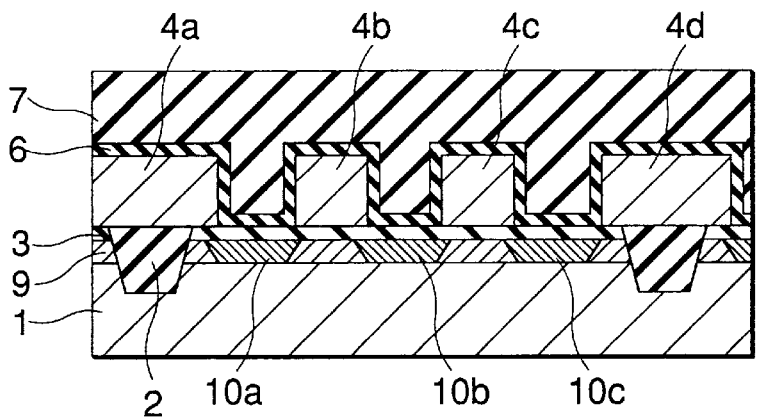

In FIG. 13(b), in the regions where the interval between the floating gate electrodes 4 is large, floating gate electrodes 4a and 4b which do not serve as the semiconductor memory device are arranged. Thus, the wide area where the interval among the floating gate electrodes 4a to 4d is beyond twice as large as the thickness of the control gate electrode 7 is not generated. This prevent the substrate from being dug.

As described above, in accordance with this embodiment, in the wide region, where the interval between the floating gate electrodes 4 operating as a semiconductor memory device is twice or more as large as the film thickness of the control gate electrode 7, the dummy floating gates 4a and 4b, which do not operate as the semiconductor memory device, are formed. For this reason, when the manufacturing method defined in claim 1 is carried out, the semiconductor substrate can be prevented from being dug in the region where the floating gate electrode 4 has been removed on the gate insulating film 3.

Now referring to the drawings, an explanation will be given of the third embodiment.

Figure 14A:
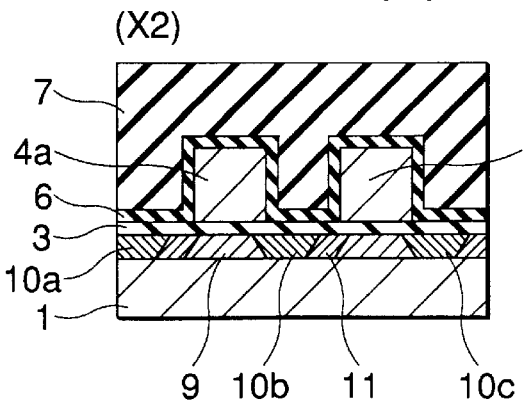
FIG. 14(A)–14(B) are a sectional view of an embodiment of the semiconductor memory device.
Figure 14B:
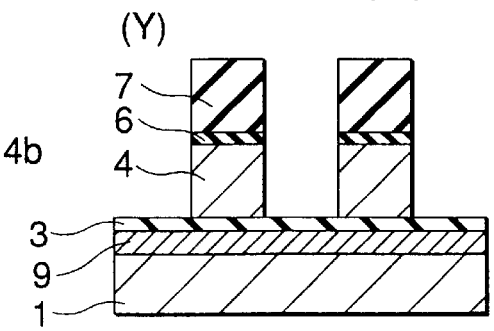

FIG. 1 is a plan view of the semiconductor memory device according to this embodiment. FIG. 14 is a sectional view.

In FIG. 14, (X2) is a sectional view taken along line X2—X2 in FIG. 1, and (Y) is a sectional view taken along line Y—Y line. In FIG. 14, like reference numerals refer to like elements in FIGS. 2–10.

In this embodiment, by slanted ion implantation, the source/drain implanted regions 10, an asymmetrical source/drain structure can be realized.

Specifically, the source for the floating gate electrode 4a is a source/drain implanted region 10a, whereas the drain therefor is a source/drain implanted region 10b. Further, the source of the floating gate electrode 4b is a source/drain implanted region 10b, whereas the drain therefor is a source/drain implanted region 10c. The device according to this embodiment operates in a virtual grounding system in which the same diffused layer serves as a source or drain for an individual cell.

The written state can be obtained, with a voltage of −10 V applied to the control gate electrode 7, a voltage of 3 V applied to the drain, source in a floating state and semiconductor substrate 1 in a grounding state, by extracting electrons from the floating gate electrode 4 to provide the threshold voltage of about 1V.

The erased state can be obtained, with a voltage of 12 V applied to the control gate 7 and the drain, source and semiconductor substrate 1 in a grounding state, by injecting electrons in the floating gate electrode 4 to provide the threshold voltage of about 4 V.

For a read operation, 3 V is applied to the control gate 7, 1 V is applied to the drain, and source and semiconductor substrate 1 is a grounded state. Then, if the device is in a written state, in which the threshold voltage is about 1 V, a current flows from a drain to a source. On the other hand, if the device is in an erased state, in which the threshold voltage is about 4 V, no current flows from the source to the drain. By detecting the difference, it is decided whether the device is in a written state or erased state. The above described voltages are exemplary, and not limited to these values.

Assuming that the thickness and width of the floating gate electrode 4 is 0.3 µm and 0.3 µm respectively, and thickness of the gate insulating film 3 is 7 nm and thickness of the gate electrode interlayer insulating film 6 is 14 nm, the capacitive coupling ratio CR, which is a performance index of the non-volatile semiconductor memory device is $$CR=0.60$$

This is equal to a standard value CR=0.60.

An explanation will be given of the fourth embodiment of the invention.

Figure 15:
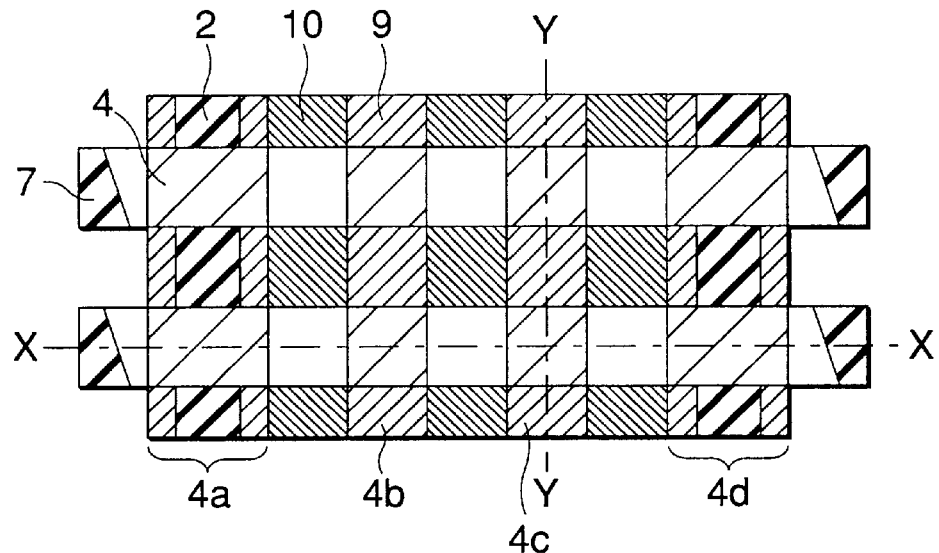
FIG. 15 is a plan view of another embodiment of the semiconductor memory device according to the invention.
Figure 16:
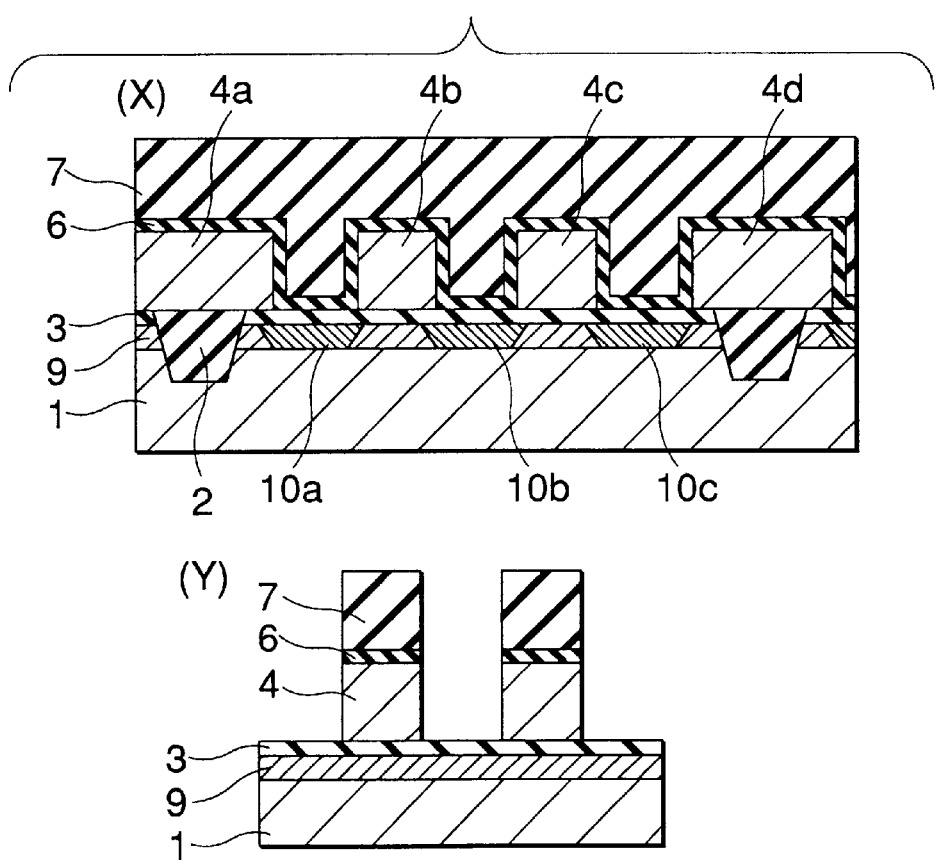
FIG. 16 is a sectional view of still another embodiment of the semiconductor memory device according to the invention.

FIG. 15 is a plan view of the semiconductor memory device according to this embodiment. FIG. 16 is a sectional view thereof. In FIG. 16, (X) is a sectional view of the portion taken along line X—X in FIG. 15, and (Y) is a sectional view of the portion taken along line Y—Y taken in FIG. 15. In FIGS. 15 and 16, reference numeral 2 denotes an element isolation insulating film, and the other reference numerals refer to the corresponding parts in FIGS. 2–10.

In this embodiment, the dummy floating gate electrodes 4a, 4b do not contribute to the function of the semiconductor memory device, but is formed for convenience for processing to provide the control gate electrode 7 having a sufficient thickness between the floating gate electrodes. On the other hand, the floating gate electrodes 4b and 4c contribute to the function of the semiconductor memory device. The source/drain implanted region 10b sandwiched between the floating gate electrodes 4b and 4c serves as a source, whereas the source/drain implanted region 10a sandwiched between the floating gate electrodes 4c and 4d and source/drain implanted region 10c sandwiched between the dummy floating gate electrodes 4a and 4d serves as a drain, respectively. The read, erase and write operation are carried out in the same manner as the embodiment shown in FIG. 14. The capacitive coupling ratio CR can also the same value.

Figure 17:
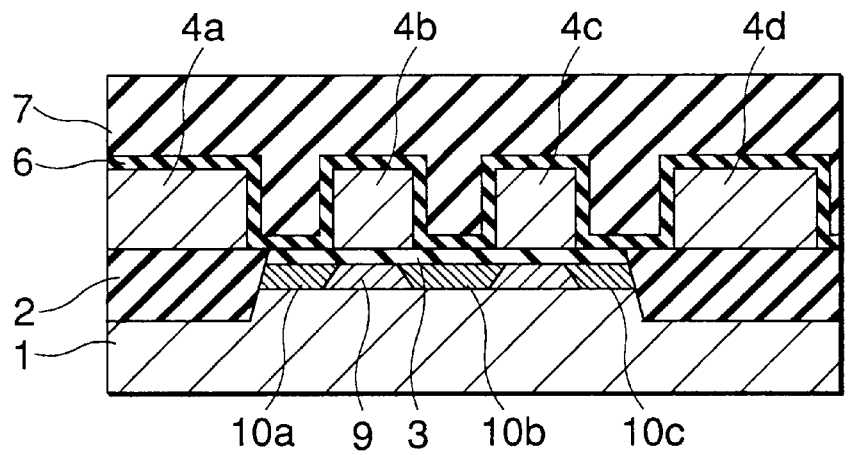
FIG. 17 is a further embodiment of the semiconductor memory device according to the invention.

In the embodiment shown in FIG. 16, the dummy floating gate electrode 4a, 4d completely covers the element isolation insulating film 2. However, as shown in FIG. 17, the ends of the dummy floating gate electrode 4a, 4d may be located on the element isolation insulating film 2.

Figure 18:
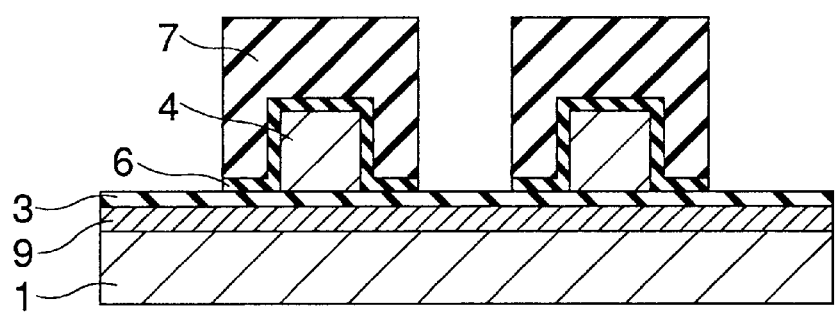
FIG. 18 is a further embodiment of the semiconductor memory device according to the invention.
Figure 19:
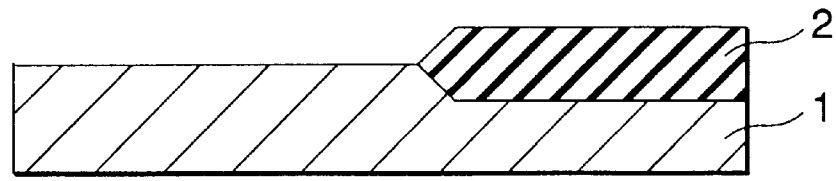
FIG. 19 is a step sectional view for explaining an example of a method for manufacturing a conventional semiconductor memory device.
Figure 20:
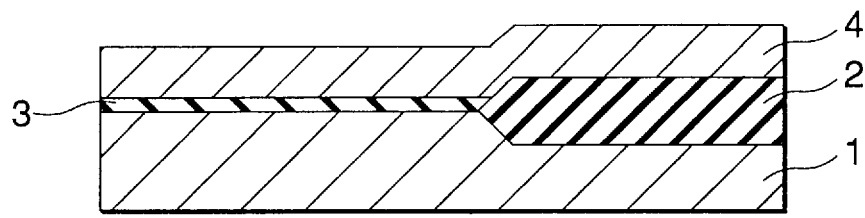
FIG. 20 is a step sectional view for explaining an example of a method for manufacturing a conventional semiconductor memory device.
Figure 21:
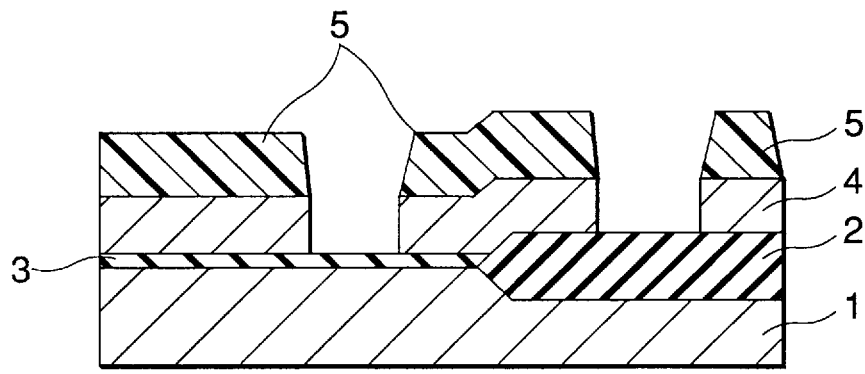
FIG. 21 is a step sectional view for explaining an example of a method for manufacturing a conventional semiconductor memory device.
Figure 22:
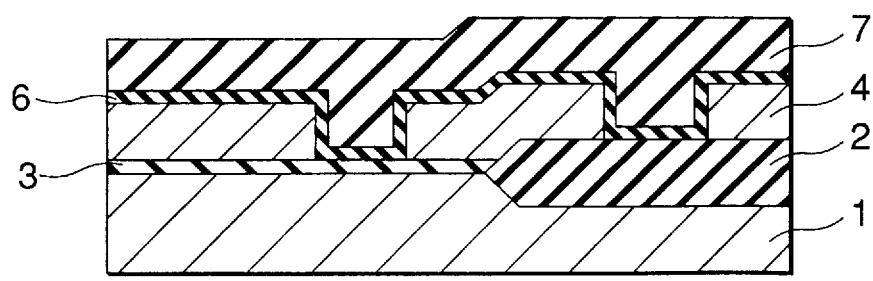
FIG. 22 is a step sectional view for explaining an example of a method for manufacturing a conventional semiconductor memory device.
Figure 23:
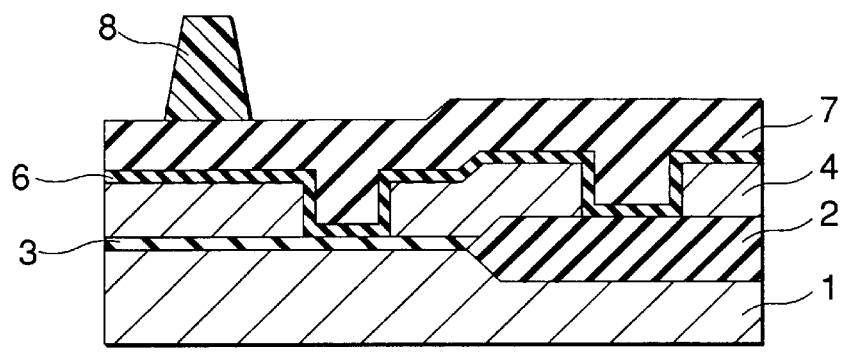
FIG. 23 is a step sectional view for explaining an example of a method for manufacturing a conventional semiconductor memory device.
Figure 24:
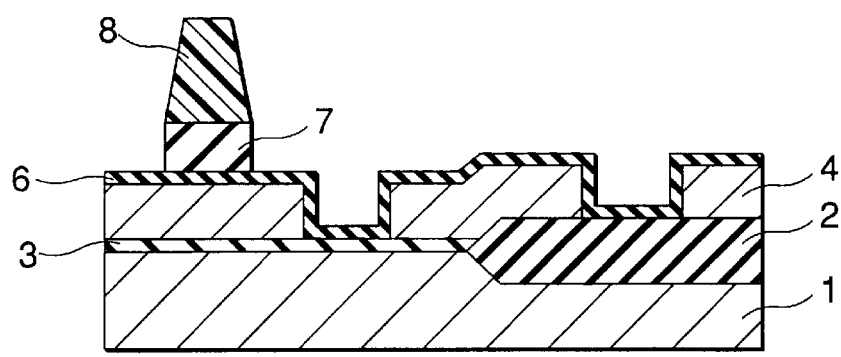
FIG. 24 is a step sectional view for explaining an example of a method for manufacturing a conventional semiconductor memory device.
Figure 25:
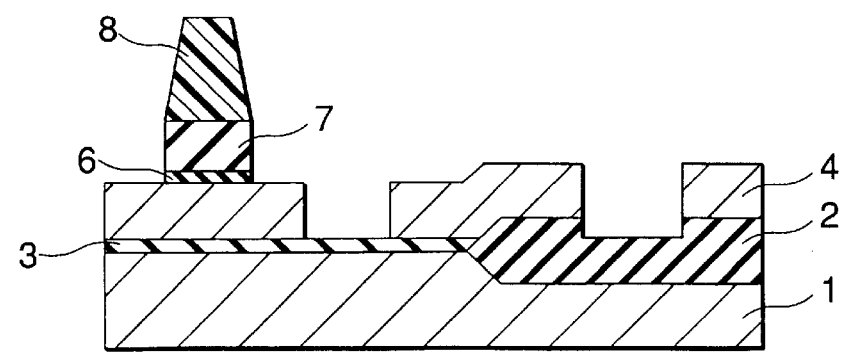
FIG. 25 is a step sectional view for explaining an example of a method for manufacturing a conventional semiconductor memory device.
Figure 26:
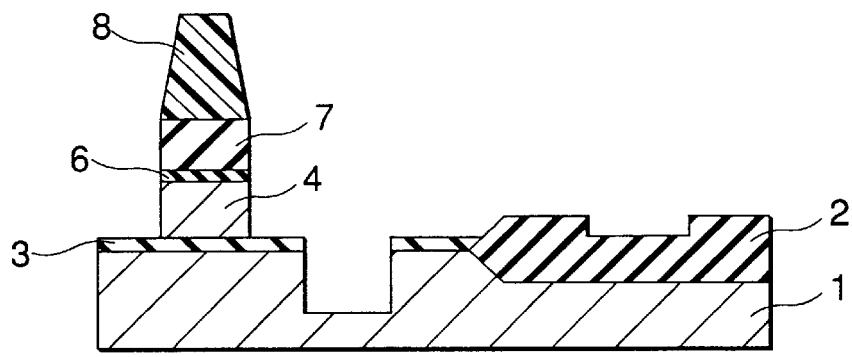
FIG. 26 is a step sectional view for explaining an example of a method for manufacturing a conventional semiconductor memory device.
Figure 27:
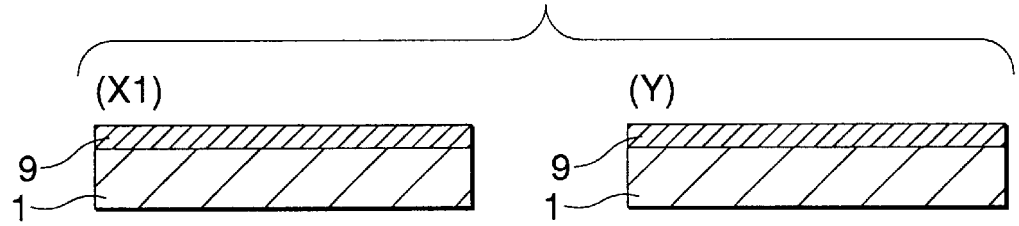
FIG. 27 is a step sectional view for explaining another example of a method for manufacturing a conventional semiconductor memory device.
Figure 28:
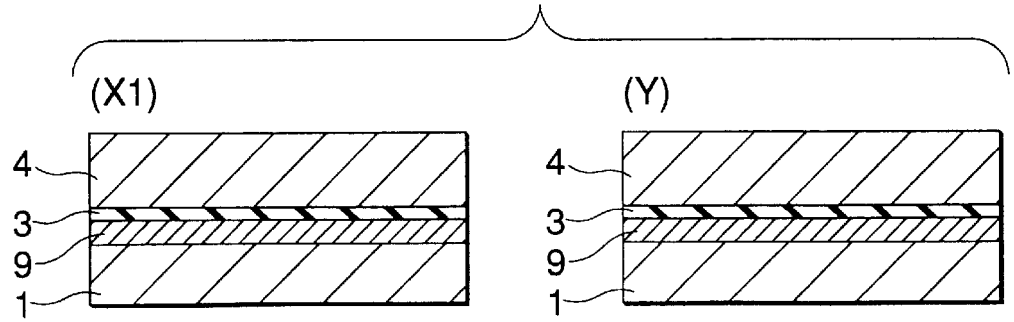
FIG. 28 is a step sectional view for explaining another example of a method for manufacturing a conventional semiconductor memory device.
Figure 29:
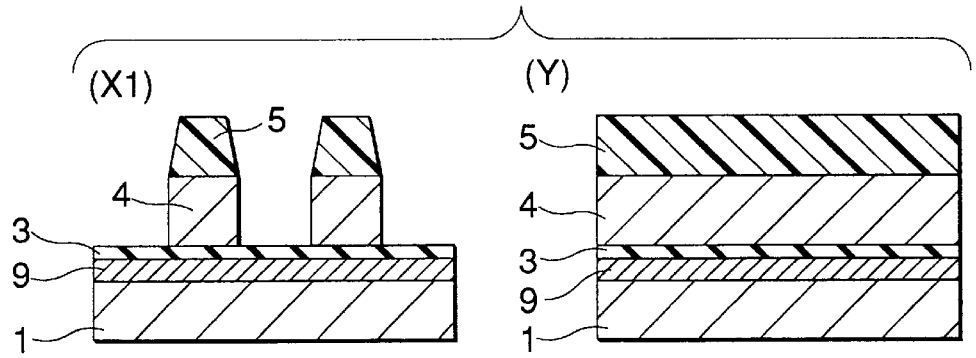
FIG. 29 is a step sectional view for explaining another example of a method for manufacturing a conventional semiconductor memory device.
Figure 30:
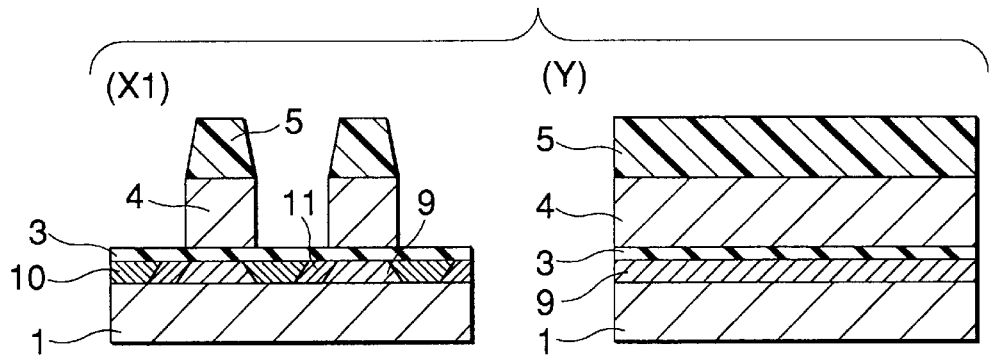
FIG. 30 is a step sectional view for explaining an example of a method for manufacturing a conventional semiconductor memory device.
Figure 31:
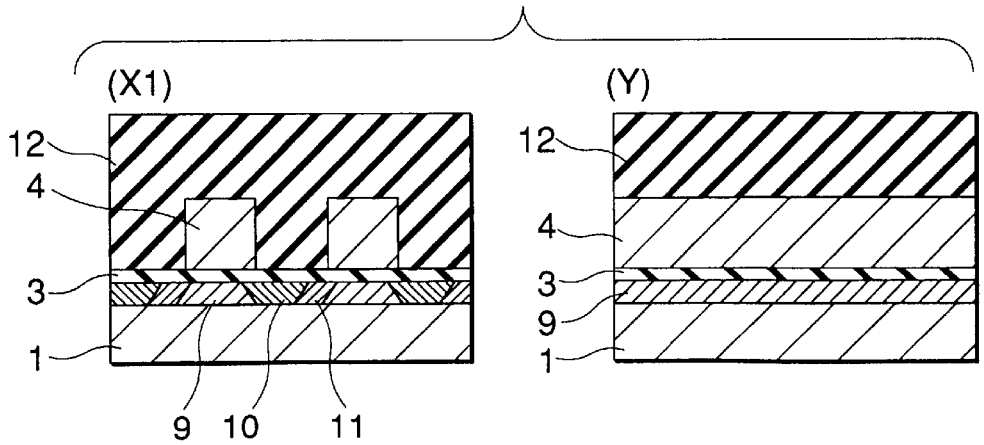
FIG. 31 is a step sectional view for explaining an example of a method for manufacturing a conventional semiconductor memory device.
Figure 32:
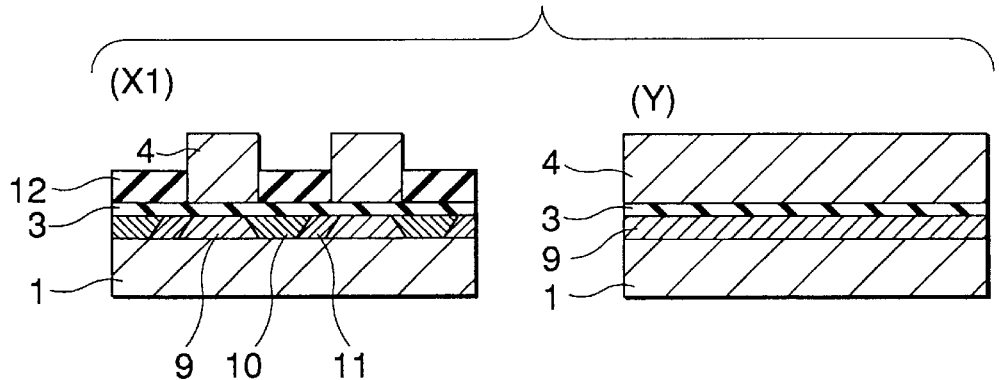
FIG. 32 is a step sectional view for explaining an example of a method for manufacturing a conventional semiconductor memory device.
Figure 33:
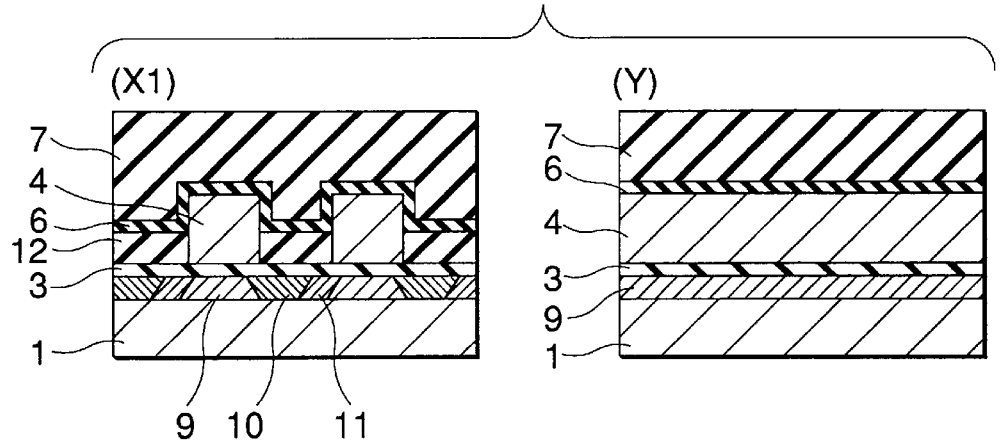
FIG. 33 is a step sectional view for explaining an example of a method for manufacturing a conventional semiconductor memory device.
Figure 34:
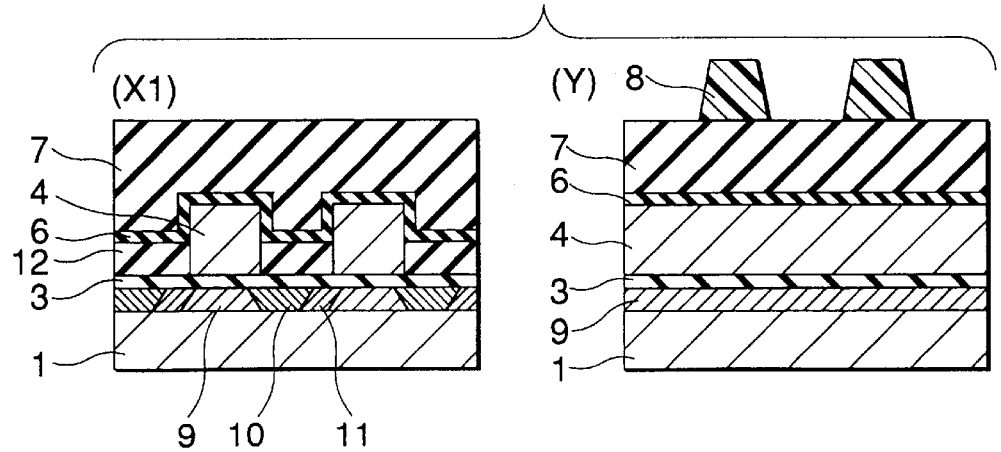
FIG. 34 is a step sectional view for explaining an example of a method for manufacturing a conventional semiconductor memory device.
Figure 35:
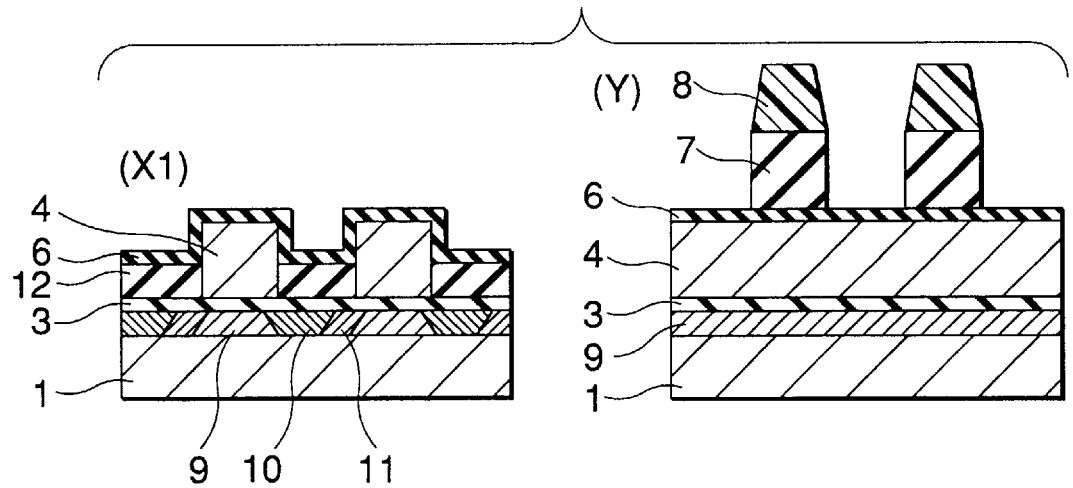
FIG. 35 is a step sectional view for explaining an example of a method for manufacturing a conventional semiconductor memory device.
Figure 36:
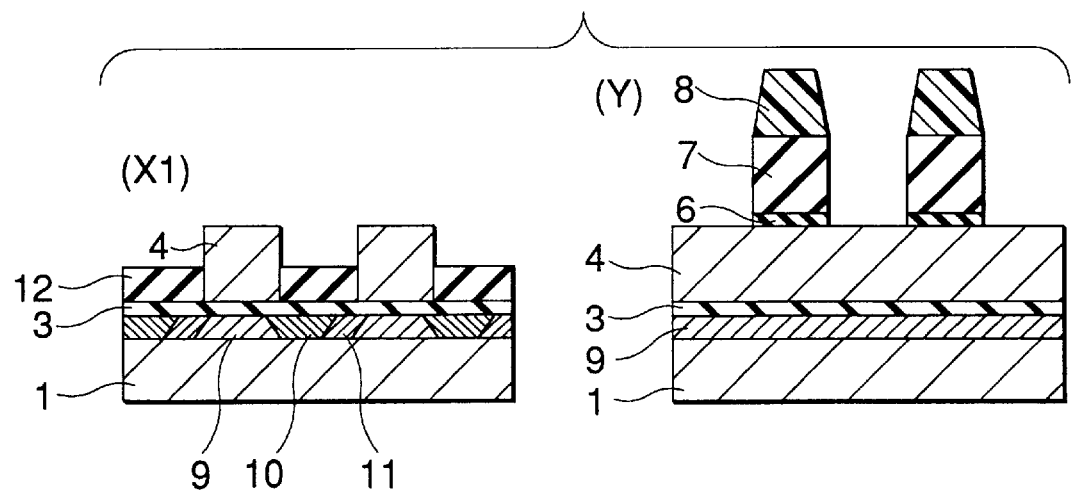
FIG. 36 is a step sectional view for explaining an example of a method for manufacturing a conventional semiconductor memory device.
Figure 37:
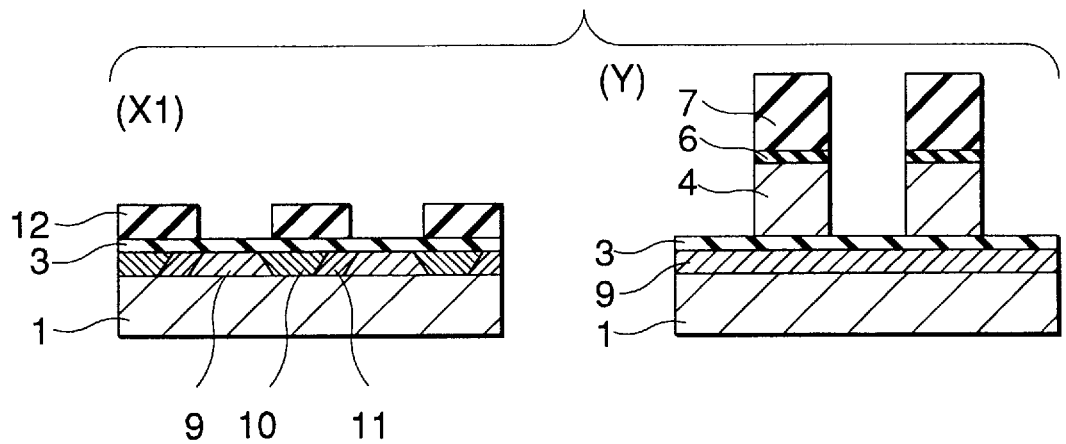
FIG. 37 is a step sectional view for explaining an example of a method for manufacturing a conventional semiconductor memory device.
Figure 38:
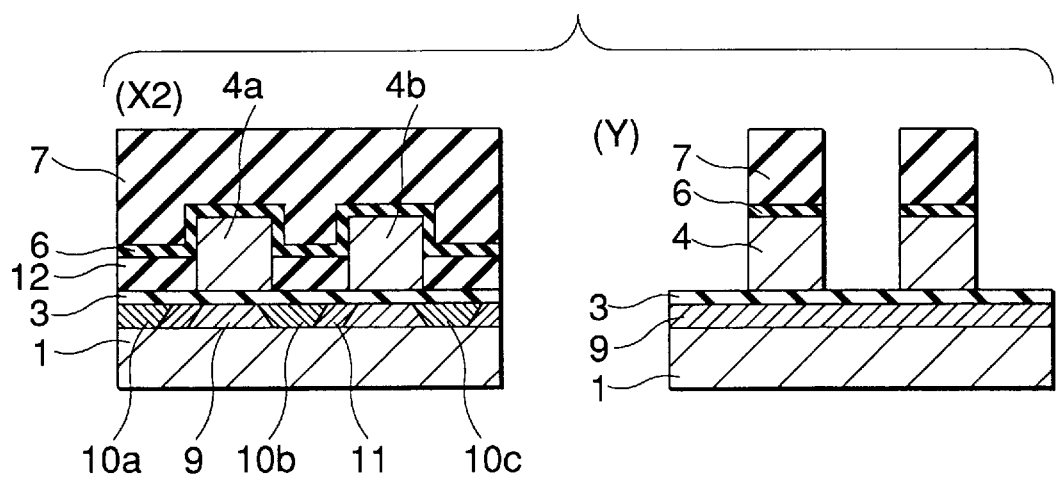
FIG. 38 is a sectional view of an example of a conventional semiconductor device.

Further, this embodiment has adopted the stacking gate electrode structure in which the control gate electrode 7 and floating gate electrode 4 are processed by the control gate electrode processing mask 8. But, another structure may be adopted in which the control gate electrode 7 covers the side wall of the floating gate electrode 4 as shown in FIG. 18 in a section of the portion taken along line Y—Y in FIGS. 1 and 15.

As described above, in accordance with this embodiment, in which the side of the floating gate electrode is covered with the gate electrode interlayer insulating film to reach the boundary between the floating gate electrode and gate insulating film formed therebelow, a sufficient capacitance between the gate electrodes and a sufficient capacitive coupling ratio can be provided by the floating gate having a small area. Thus, an excellent semiconductor memory device having a small size and high performance function can be realized.

The method of manufacturing a semiconductor memory device according to the present invention has a step of partially leaving the control gate electrode in the region where the floating gate electrode has been removed, when the control gate electrode is processed. For this reason, this method can easily prevent the semiconductor substrate from being dug.

In accordance with the semiconductor memory device, in which the side of the floating gate electrode is covered with the gate electrode interlayer insulating film to reach the boundary between the floating gate electrode and gate insulating film formed therebelow, a sufficient capacitance between the gate electrodes and a sufficient capacitive coupling ratio can be provided by the floating gate having a small area.

What is claimed is:

1. A method of fabricating a semiconductor memory device comprising the steps:

forming a gate insulating film on a semiconductor substrate;

forming a first conductive film for a floating gate electrode on the gate insulating film;

selectively removing the first conductive film to form a slit on a region corresponding to an interval of the floating gate electrode;

forming a gate electrode interlayer insulating film on the first conductive layer and in the slit;

forming a second conductive layer for the control gate electrode on the gate electrode interlayer insulating film so as to be embedded substantially completely within the slit;

selectively removing the second conductive film to expose the gate electrode insulating film and to form the control gate electrode so that a portion of the second conductive film within the slit is left;

removing the gate electrode interlayer insulating film exposed on a surface of the first conductive layer and in the slit; and removing the second conductive film remaining within the slit and the first conductive film exposed on a surface of the substrate to form the floating gate electrode.

2. The method of fabricating a semiconductor memory device as claimed in claim 1, wherein the width of the slit is twice or less as large as a thickness of the second conductive film.

3. The method of fabricating a semiconductor memory device as claimed in claim 1, wherein the width of control gate electrode is larger than that of the floating gate electrode.

4. The method of fabricating a semiconductor memory device as claimed in claim 1, wherein a thickness of the first conductive film is half or more as thick as the second conductive film.

5. The method of fabricating a semiconductor memory device as claimed in claim 1 wherein the step of selectively removing the first conductive film is a step of etching selectively the first conductive film so that the slit reaches to the gate insulating film.

6. The method of fabricating a semiconductor memory device as claimed in claim 1, wherein the step of selectively removing the first conductive film is a step of etching the first conductive film so that a dummy floating gate electrode not directly contributing to a memory function is remained in a region where the interval between the floating gate electrodes contributing to the memory function.

7. The method of fabricating a semiconductor memory device as claimed in claim 6, wherein the region is located so that the interval between juxtaposed two of the floating gate electrodes and the dummy floating gate electrodes is twice or less as large as the thickness of each of the control gate electrode.

* * * * *